United States Patent [19]

Bialas, Jr. et al.

[11] Patent Number: 4,621,345
[45] Date of Patent: Nov. 4, 1986

[54] SOFT ERROR PROTECTION CIRCUIT FOR A STORAGE CELL

[75] Inventors: John S. Bialas, Jr., Manassas; Richard J. Daniels, Dumfries; Joseph W. Yoder, Fairfax, all of Va.

[73] Assignee: International Business Machines Corporation, Armonk, N.Y.

[21] Appl. No.: 682,120

[22] Filed: Dec. 17, 1984

[51] Int. Cl.⁴ .................. G11C 7/02; G11C 11/40
[52] U.S. Cl. ............................................. 365/205
[58] Field of Search .............. 365/154, 155, 156, 181, 365/190, 205

[56] References Cited

U.S. PATENT DOCUMENTS 4,314,359 2/1982 Kato et al. ................ 365/179

OTHER PUBLICATIONS

Electronics–May 22, 1980, pp. 119–129.

*Primary Examiner*—James W. Moffitt
*Attorney, Agent, or Firm*—John E. Hoel

[57] ABSTRACT

A soft error protection circuit is disclosed for a storage cell, such as a latch having a first input/output node and a second input/output node which are respectively connected to a charging source, the first node being selectively charged at least during a write interval, to represent a stored, first binary logic state for the latch. The circuit includes an insulated gate, field effect capacitor having a diffusion electrode connected to the second node and having a gate electrode, for selectively loading the second node with an additional capacitance. An inverter circuit has an input connected to the second node and an output connected to the gate electrode of the capacitor, for applying a capacitance enhancing bias to the gate electrode in at least a read interval following the write interval, when the first binary logic state has been stored in the latch, to apply the additional capacitance to the second node. The charging source supplies charge to both the first node and the second node at least following a soft error event which has caused the first node to become at least partially discharged during the read interval. In accordance with invention, the additional capacitance applied to the second node prevents the second node from recharging as fast as the first node following the soft error event, by sinking a portion of the charge supplied from the charging source to the second node. In this manner, the first node will resume its previously charged condition, thereby preserving the stored logic state.

6 Claims, 7 Drawing Figures

FIG. 6
LOW GATE-TO-CHANNEL
CAPACITANCE

FIG. 7
HIGH GATE-TO-CHANNEL
CAPACITANCE

SOFT ERROR PROTECTION CIRCUIT FOR A STORAGE CELL

FIELD OF THE INVENTION

The invention disclosed herein broadly relates to transistor circuits and more particularly relates to protective circuits for preserving the stored binary state of a transistor circuit storage device.

BACKGROUND OF THE INVENTION

As the number of devices in a very large scale integrated (VLSI) circuit chip surpasses $10^5$, the individual transistor devices which form its component elementary logic circuits, occupy areas of the chip on the order of a few square microns. The quantity of charge which is transferred between field effect transistor devices of this size while carrying out normal switching operations, is on the order of 0.1 picoCoulombs ($10^{-12}$ Coulombs), making them very susceptible to electrostatic perturbations.

One ubiquitous source of such perturbations is cosmic rays, a highly penetrating radiation apparently reaching the earth in all directions from outer space. The primary cosmic rays entering the earth's atmosphere are almost entirely composed of positively charged atomic nuclei which collide with air nuclei high in the atmosphere, forming showers of positively and negatively charged nuclear fragments called secondary cosmic rays. These secondary cosmic rays penetrate all matter at the earth's surface and as they pass through a material object, they undergo collisions with the electrons and nuclei of which the material is composed, leaving a track of electrostatic charge along the way. The linear charge density along such a track can be typically 0.1 picoCoulombs per micron, which is on the same scale as the quantity of charge involved in the switching operation of a single field effect transistor on a VLSI chip.

This becomes a significant problem in latch circuits composed of such devices, since a latch must sense and reliably store a binary bit of information for intervals measurable in millions of machine cycles. In order to better understand this problem, reference will be made to a typical integrated circuit field effect transistor latch and the mechanism of its response to an electrostatic perturbation such as cosmic ray, will be discussed.

To begin this description, several terms need to be defined and suitable abbreviations established. The N channel field effect transistor circuit technology will be the example used herein. The abbreviation NFET will be used herein to refer to an N channel field effect transistor device. Such devices are generally fabricated by forming an N-type conductivity source diffusion and N-type diffusion in the surface of a P-type conductivity silicon substrate. The channel region of the substrate separating the source and drain regions, is covered by a gate insulator layer and a gate electrode. An enhancement mode NFET is normally nonconducting between its source and drain and it can be switched into conduction by applying a positive potential to its gate electrode, with respect to the potential of its source. A depletion mode NFET is normally conducting between its source and drain and it can be switched into nonconduction by applying a negative potential to its gate electrode, with respect to the potential of its source.

Figure 1:
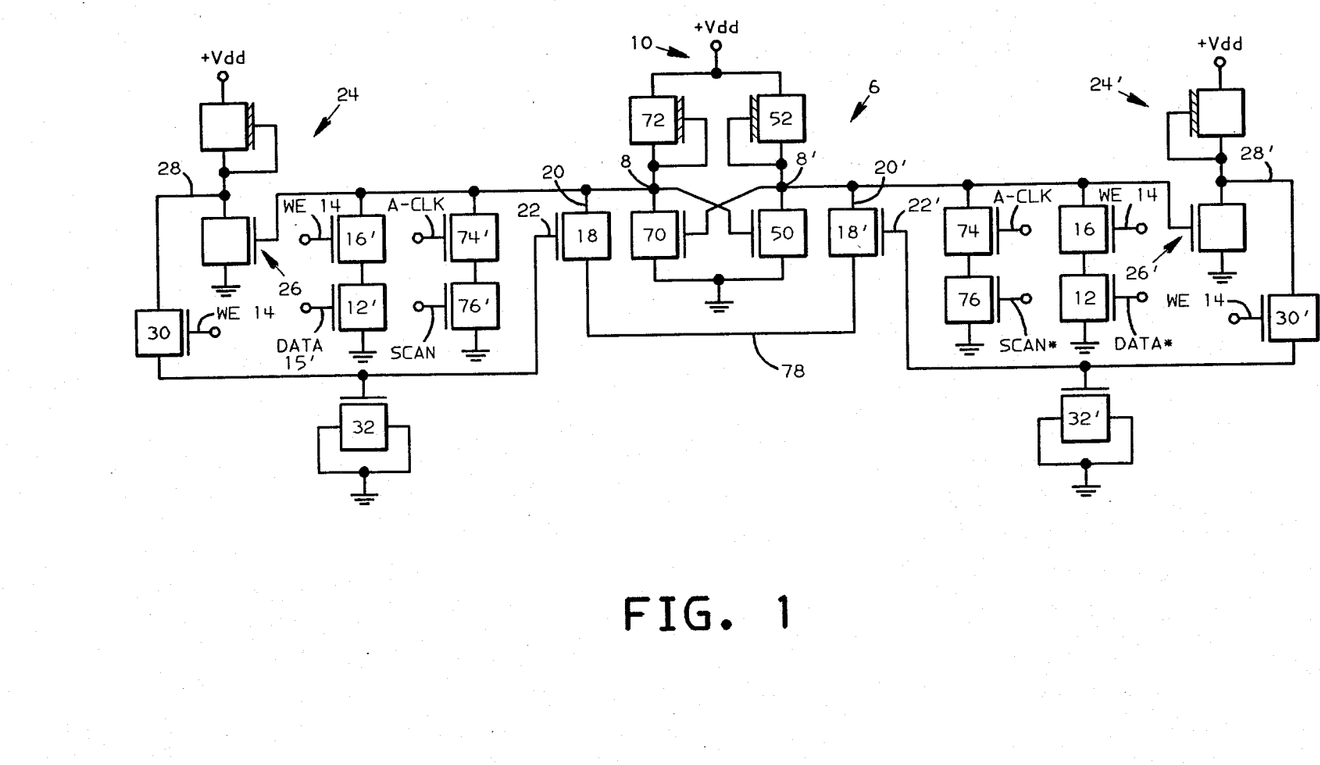
FIG. 1 is a circuit schematic diagram showing the soft error protection circuit invention connected to a level sensitive scan design latch.

A typical NFET integrated circuit latch 6 is shown in a portion of FIG. 1. The latch 6 is a level sensitive scan design (LSSD) latch which stores one binary bit of information, and can be used either to store a test bit during test operations or it can store a data bit during normal logic function operations. The latch 6 consists of a pair of cross-coupled inverters. The first inverter is composed of the NFET enhancement mode active device 50 and the NFET depletion mode load device 52 which are series-connected between the drain potential Vdd at 10 of approximately five volts and ground potential. The convention is adopted that the drain potential of Vdd represents a binary logic value of "1" and ground potential represents a binary logic value of "0."

In normal operation, when a binary "1" signal of Vdd potential is applied by the node 8 to the gate of device 50, the gate of device 50 is positively biased with respect to its source and therefore it conducts the current supplied by the load device 52, dropping the potential of the output node 8' of the inverter to the binary "0," ground potential. Alternately, when a binary "0" signal of ground potential is applied by the node 8 to the gate of device 50, the gate of device 50 is not positively biased with respect to its source and therefore it no longer conducts the current supplied by the load device 52. Thus, the load device 52 charges node 8' to a binary "1," at which time there is no longer a potential difference between its source and drain. That is, the binary "1" potential of Vdd exists at the output node 8' and the load device 52 is no longer conducting current. Since the gate electrode is connected to the source for the load device 52, it is never negatively biased with respect to the source and therefore the load device is always capable of supplying current to the node 8' whenever the potential of the node 8' is less than the drain potential Vdd.

As can be seen from FIG. 1, the latch 6 is made up of two inverters, the first inverter being devices 50 and 52 and the second inverter being devices 70 and 72. The second inverter is identical to the first inverter, devices 50 and 70 being both NFET enhancement mode devices and devices 52 and 72 being both NFET depletion mode devices. By cross-coupling the output node 8' of the first inverter to the gate of the active device 70 of the second inverter and cross-coupling the output node 8 of the second inverter to the gate of the active device 50 of the first inverter, positive feedback reinforcement of the present conduction state of each respective inverter is obtained. It is in this manner that a binary bit of information can be stored in the latch. By convention, when the first node 8' is at a higher potential than the second node 8, the latch 6 will be storing a binary "1" value and when the first node 8' is at a lower potential than the second node 8, the latch 6 will be storing a binary "0" value. The state of the binary bit stored in the latch 6 can be read by sensing the relative potential of the first node 8' with respect to the second node 8, or by sensing the individual nodes 8 or 8', exclusively.

In order to write a new data bit into the latch 6, a first data input circuit is connected to the first node 8' consisting of the series-connected NFET enhancement mode devices 12 and 16 and a second data input circuit is connected to the second node 8 consisting of the series-connected NFET enhancement mode devices 12' and 16'. The gates of devices 16 and 16' are connected to a write-enable (WE) input 14 which, when on, defines the write intervals when the state of the latch 6 can be changed. In LSSD terminology, the write-enable signal is also known as the "C-clock." If the DATA* input 15 to the gate of device 12 is on while the WE input 14 to the gate of device 16 is on, then the first node 8' is connected to ground potential and the latch 6 has its binary storage state changed to the "0" state. The use of the "*" notation herein following the expression for a binary logic variable, indicates the binary complement of that variable. Alternately, if the DATA input 15' to the gate of device 12' is on while the WE input 14 to the gate of device 16' is on, then the second node 8 is connected to ground potential and the latch 6 has its binary storage state changed to the "1" state.

If the latch 6 also has test inputs to accept LSSD scan string test bits then circuit testing is desired. In order to write a new scan bit into the latch 6, a first scan input circuit is connected to the first node 8' consisting of the series-connected NFET enhancement mode devices 76 and 74 and a second scan input circuit is connected to the second node 8 consisting of the series-connected NFET enhancement mode devices 76' and 74'. The gates of devices 74 and 74' are connected to the A-clock (A-CLK) input which, when on, defines the scan-write intervals when the state of the latch 6 can be changed. If the SCAN* input to the gate of device 76 is on while the A-CLK input to the gate of device 74 is on, then the first node 8' is connected to ground potential and the latch 6 has its binary storage state changed to the "0" state. Alternately, if the SCAN input to the gate of device 76' is on while the A-CLK input to the gate of device 74' is on, then the second node 8 is connected to ground potential and the latch 6 has its binary storage state changed to the "1" state.

Figure 2:
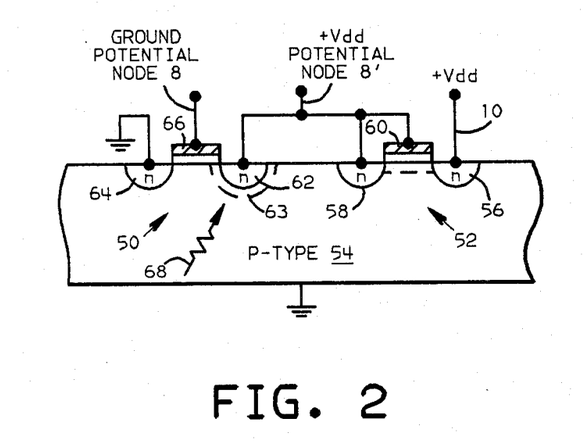
FIG. 2 is a cross-sectional view of the semiconductor structure of a portion of the latch 6, to illustrate how a cosmic ray can cause a soft error in the latch.

The effect of an electrostatic perturbation, such as a cosmic ray, on the binary storage state of a latch can be better understood by examining the cross-sectional view of the structure of the first inverter in the latch 6, as is depicted in FIG. 2. The NFET enhancement mode active device 50 and the NFET depletion mode load device 52 are shown in FIG. 2 as being formed in the P-type silicon substrate 54. The load device 52 has its N-type drain 56 and its N-type source 58 formed in the P-type substrate 54, and the gate insulator and the gate electrode 60 formed over the channel region separating the source 58 and drain 56. The load device 52 is made a depletion mode by ion implanting an N-type dopant in the channel region thereof. The drain 56 is connected to the positive drain potential Vdd. The source 58 and the gate 60 are connected in common to the latch node 8'. The substrate 54 is connected to ground potential and therefore the source 58 and the drain 56, which are both N-type, form a reversed bias junction with the P-type substrate 54.

The active device 50 has its N-type drain 62 and its N-type source 64 formed in the P-type substrate 54, and the gate insulator and the gate electrode 66 formed over the channel region separating the source 64 and drain 62. The drain 62 is connected to the latch node 8' and the source 64 is connected to ground potential. When the latch 6 is in its binary "1" state, the first inverter has its output node 8' at the positive Vdd potential and the gate electrode 66 of the active device 50 is at ground potential, keeping the active device 50 nonconducting. The positive potential of the N-type drain diffusion 62 with respect to the ground potential of the substrate 54, creates a reversed bias PN junction 63 between the drain 62 and the substrate 54.

The reversed bias PN junction 63 forms a region which is depleted of charge carriers, bounded by a layer of electrons on the N-type side and by a layer of positive charges on the P-type side. This creates an electric field in the depleted region of junction 63 which will sweep out any free charges which may occur therein, causing a small current. If the electrostatically charged track of a cosmic ray 68 passes within the vicinity of the reversed bias PN junction 63, the charges liberated in the depletion region of the junction 63 are swept out, causing a current spike of up to 30 milliamperes for a duration of from 0.1 to 0.2 nanoseconds. The charges stored in the node 8' are conducted through the PN junction 63 to the substrate 54, thereby discharging the node 8', dropping its potential toward ground potential. If the electrostatic perturbation is sufficiently large, it will drop the potential of node 8' as low as one forward biased PN junction potential difference below the potential of substrate 54.

At this juncture, both the first node 8' and the second node 8 of the latch 6, are at approximately ground potential. Since both the depletion mode load 52 and the depletion mode load 72 are capable of supplying current to the nodes 8' and 8, respectively, whenever those nodes are at a lower potential than the drain potential Vdd, each load device 52 and 72 tries to drive its respective node 8' and 8 up in potential. Due to the random conditions of resistive and capacitive balance between the two nodes 8 and 8', the restored state of the latch 6 after the electrostatic perturbation is a random occurrence. If the restored state of the latch 6 is different from the original state prior to the perturbation, then a soft error has occurred.

OBJECTS OF THE INVENTION

It is therefore an object of the invention to protect a storage cell from soft errors.

It is another object of the invention to minimize the effect of cosmic rays, alpha rays and other ionizing radiation on an integrated circuit storage cell.

SUMMARY OF THE INVENTION

These and other objects, features and advantages are accomplished by the invention disclosed herein. A soft error protection circuit is disclosed for a storage cell, such as a latch having a first input/output node and a second input/output node which are respectively connected to a charging source, the first node being selectively charged at least during a write interval, to represent a stored, first binary logic state for the latch.

The protection circuit includes an insulated gate, field effect capacitor having its diffusion electrode connected to the second node and having a gate electrode, for selectively loading the second node with an additional capacitance.

Also included is an inverter circuit having an input connected to the second node and an output connected to the gate electrode of the capacitor, for applying a capacitance enhancing bias to the gate electrode in at least a read interval following the write interval, when the first binary logic state has been stored in the latch, to apply the additional capacitance to the second node.

The charging source supplies charge to both the first node and the second node at least following a soft error event which has caused the first node to become at least partially discharged during the read interval.

In accordance with the invention, the additional capacitance applied to the second node prevents the second node from recharging as fast as the first node following the soft error event, by sinking a portion of the charge supplied from the charging source to the second node, the first node resuming its previously charged condition.

The latch being protected is symmetric in its operation, and thus the second node is selectively charged at least during a second write interval, to represent a stored, second binary logic state for the latch.

The protective circuit further includes a second insulated gate, field effect capacitor having a diffusion electrode connected to the first node and having a second gate electrode, for selectively loading the first node with a second additional capacitance.

The circuit also has a second inverter circuit having an input connected to the first node and an output connected to the second gate electrode of the second capacitor, for applying a capacitance enhancing bias to the second gate electrode in at least a second read interval following the second write interval, when the second binary logic state has been stored in the latch, to apply the second additional capacitance to the first node.

The charging source supplies charge to both the second node and the first node at least following a second soft error event which has caused the second node to become at least partially discharged during the second read interval.

Still further in accordance with the invention, the second additional capacitance applied to the first node prevents the first node from recharging as fast as the second node following the second soft error event, by sinking a portion of the charge supplied from the charging source to the first node, the second node resuming its previously charged condition.

In this manner, the stored logic state of the latch is preserved following a soft error event.

DESCRIPTION OF THE FIGURES

These and other objects, features and advantages of the invention will be more fully appreciated with reference to the accompanying figures.

PREFERRED EMBODIMENT OF THE INVENTION

The structure and operation of a basic, level sensitive scan design, integrated circuit latch with its complementary data inputs and its complementary test scan inputs, which is shown in a portion of FIG. 1, was described above in the Background of the Invention section. The invention herein deals with the switched capacitive loading of the nodes of that latch for soft error protection. This protective function is provided by the balance of the integrated circuit shown in FIG. 1, which is described as follows.

The soft error protection circuit of FIG. 1 includes a first insulated gate, field effect capacitor 18 (herein abbreviated MOS capacitor 18) having a diffusion electrode 20 connected to the second node 8 and having a gate electrode 22, for selectively loading the second node 8 with a first additional capacitance when its gate 22 is biased with respect to the diffusion electrode 20.

Figure 6:
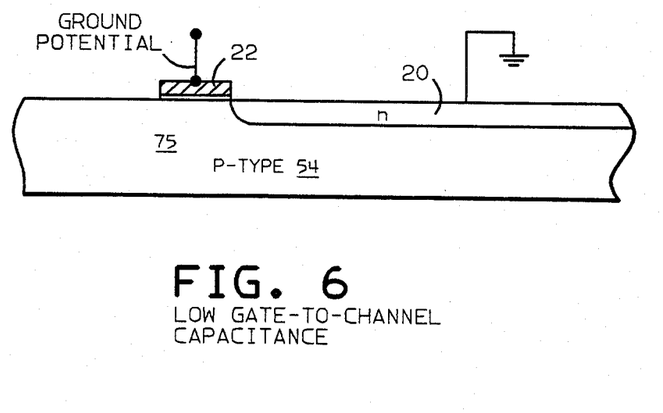
FIG. 6 is a cross-sectional view of the MOS capacitor 18, with no bias on the gate 22 with respect to the drain diffusion 20, thereby producing a relatively negligible gate-to-channel capacitance characteristic.
Figure 7:
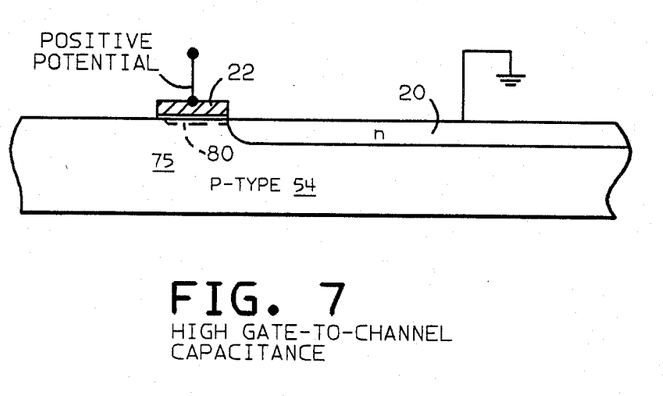
FIG. 7 is a cross-sectional view of the MOS capacitor 18, with a positive bias on the gate 22 with respect to the drain diffusion 20, which produces a charge mirror plate 80 which substantially increases the gate-to-channel capacitance over that of the zero bias condition of FIG. 6.

FIGS. 6 and 7 show the cross-sectional view of the insulated gate field effect capacitor 18, hereinafter referred to as an MOS capacitor. The MOS capacitor 18 is composed of the N-type diffusion 20 which is formed in the surface of the P-type substrate 54, and is connected to the node 8 of the latch 6. The region of the substrate 54 adjacent to the end of the diffusion 20 is referred to as the channel region 75. Above the channel region 75 is positioned an insulating layer and above the insulating layer is the gate electrode 22. As is illustrated in FIG. 6, if the gate electrode 22 is not biased positively with respect to the diffusion 20, then the gate-to-channel capacitance of the MOS capacitor is very small. However, if the gate electrode 22 is biased positively with respect to the diffusion 20, as is shown in FIG. 7, then a sheet of negative charge 80 is formed in the channel region 75 beneath the gate electrode 22. This sheet of negative charge 80 is a charge mirror to the positive charges in the positively biased gate electrode. The sheet of negative charge 80 is a charge inversion layer which extends out from the diffusion 20 and which has the same potential as the diffusion 20. The sheet of charge 20 serves as one plate of a parallel plate capacitor, the other plate being the gate electrode 22. Thus, when the gate electrode of the MOS capacitor is positively biased with respect to the diffusion 20, a substantially large gate-to-channel capacitance is formed.

Figure 4:
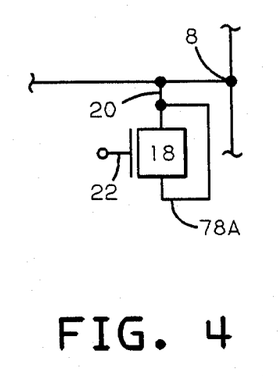
FIG. 4 is a schematic diagram of a first alternate embodiment for the capacitor 18 and its connection to the balance of the circuit of FIG. 1.
Figure 5:
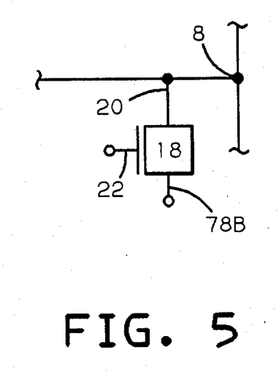
FIG. 5 is a schematic diagram of a second alternate embodiment for the capacitor 18 and its connection to the balance of the circuit of FIG. 1.

The MOS capacitor 18 can be formed from a conventional NFET enhancement mode device, as is shown in FIGS. 1, 4 and 5. It is not necessary to use both the source and the drain diffusions in an NFET device, in order to make an MOS capacitor. The three different embodiments of FIGS. 1, 4 and 5 represent three different ways of connecting the source diffusion of an NFET capacitor, the drain diffusion being connected to the latch node 8 in each case.

In the first embodiment of FIG. 1, the source diffusion 78 of the MOS capacitor 18 is connected in common to the source diffusion of the MOS capacitor 18'. This embodiment improves performance by redistributing charge during the write interval when the polarity of the nodes 8 and 8' are being switched.

In FIG. 4, the source diffusion 78A of the MOS capacitor 18 is connected to its drain diffusion 20. This same connection would also be used for the MOS capacitor 18'.

In FIG. 5, the source diffusion 78B of the MOS capacitor 18 is left unconnected so that its potential floats. The diffusion 78B could in fact be eliminated in this embodiment. The same connection could also be used for the MOS capacitor 18'.

The circuit also includes a first inverter 24 having an input 26 connected to the second node 8 and an output 28. The inverter 24 has an NFET depletion mode load and an NFET enhancement mode active device.

A first transfer field effect transistor device 30 has its source-drain path connected between the output of the inverter 24 and the gate electrode 22 of the first capacitor, and has its gate connected to the write-enable input 14, for applying a capacitance enhancing bias produced by the output of the first inverter 24 to the gate electrode 22 of the first capacitor in the write interval when the write-enable input 14 is on, to apply the first additional capacitance to the second node 8. Device 30 is an NFET enhancement mode device.

The charging source 10 supplies charge to both the first node 8' and the second node 8 at least following a soft error event which has caused the first node 8' to become at least partially discharged during a first read interval following the first write interval.

In accordance with the invention, the first additional capacitance applied to the second node 8 prevents the second node 8 from recharging as fast as the first node 8' following the soft error event, by sinking a portion of the charge supplied from the charging source 10 to the second node 8, so that thereby the first node 8' will resume its previously charged condition.

The circuit of FIG. 1 is symmetric with respect to the latch 6, so that if a soft error occurs on either side of the latch 6, the latch will be able to resume its previously charged condition.

The soft error protection circuit further includes a second insulated gate, field effect capacitor 18' (herein abbreviated as MOS capacitor 18') having a diffusion electrode 20' connected to the first node 8' and having a gate electrode 22', for selectively loading the first node 8' with a second additional capacitance when its gate 22' is biased with respect to its diffusion electrode 20'. The MOS capacitor 18' is similar to the MOS capacitor 18.

The circuit also has a second inverter 24' having an input 26' connected to the first node 8' and an output 28'. The inverter 24' is similar to the inverter 24.

Still further, the circuit has a second transfer field effect transistor device 30' having its source-drain path connected between the output of the second inverter 24' and the gate electrode 22 of the second insulated gate field effect capacitor 18', and having its gate connected to the write-enable input 14, for applying a capacitance enhancing bias produced by the output of the second inverter 24' to the gate electrode of the second insulated gate field effect capacitor 18' in the second write interval when the write-enable input 14 is on, to apply the second additional capacitance to the first node 8'. The transfer device 30' is similar to the transfer device 30.

The charging source 10 supplies charge to both the second node 8 and the first node 8' at least following a soft error event which has caused the second node 8 to become at least partially discharged during a second read interval following the second write interval.

Still further in accordance with the invention, the second additional capacitance applied to the first node 8' prevents the first node 8' from recharging as fast as the second node 8 following the soft error event, by sinking a portion of the charge supplied from the charging source 10 to the first node 8', so that thereby the second node 8 will resume its previously charged condition.

In this manner, the stored logic state of the latch 6 is preserved following a soft error event.

An additional feature is a first ballast capacitor 32 connected between the gate of the first insulated gate field effect capacitor 18 and the first transfer field effect transistor 30, for maintaining the capacitance enhancing bias on the gate electrode 22 of the first insulated gate field effect capacitor 18 during the first read interval following the first write interval, when the write-enable input 14 is off. The ballast capacitor 32 is an NFET depletion mode device with a gate-to-channel capacitance of approximately 0.2 picoFarads. The ballast capacitor 32 will also maintain the bias on gate 22 during momentary variations in the power being supplied to latch 6. This provides a degree of nonvolatility to the latch 6.

Similarly, on the other side of the latch 6 is a second ballast capacitor 32' connected between the gate of the second insulated gate field effect capacitor 18' and the second transfer field effect transistor 30', for maintaining the capacitance enhancing bias on the gate electrode 22 of the second insulated gate field effect capacitor 18' during the second read interval following the second write interval, when the write-enable input is off. The ballast capacitor 32' is similar to the ballast capacitor 32.

OPERATION OF THE INVENTION

The operation of the soft error protection circuit will be illustrated with reference to the timing diagram of FIG. 3. When a signal is referred to as being "on," it will be in the binary "1" state or will have a potential of positive Vdd. When a signal is referred to as being "off," it will be in the binary "0" state or will have a potential of ground.

NORMAL OPERATION

Figure 3:
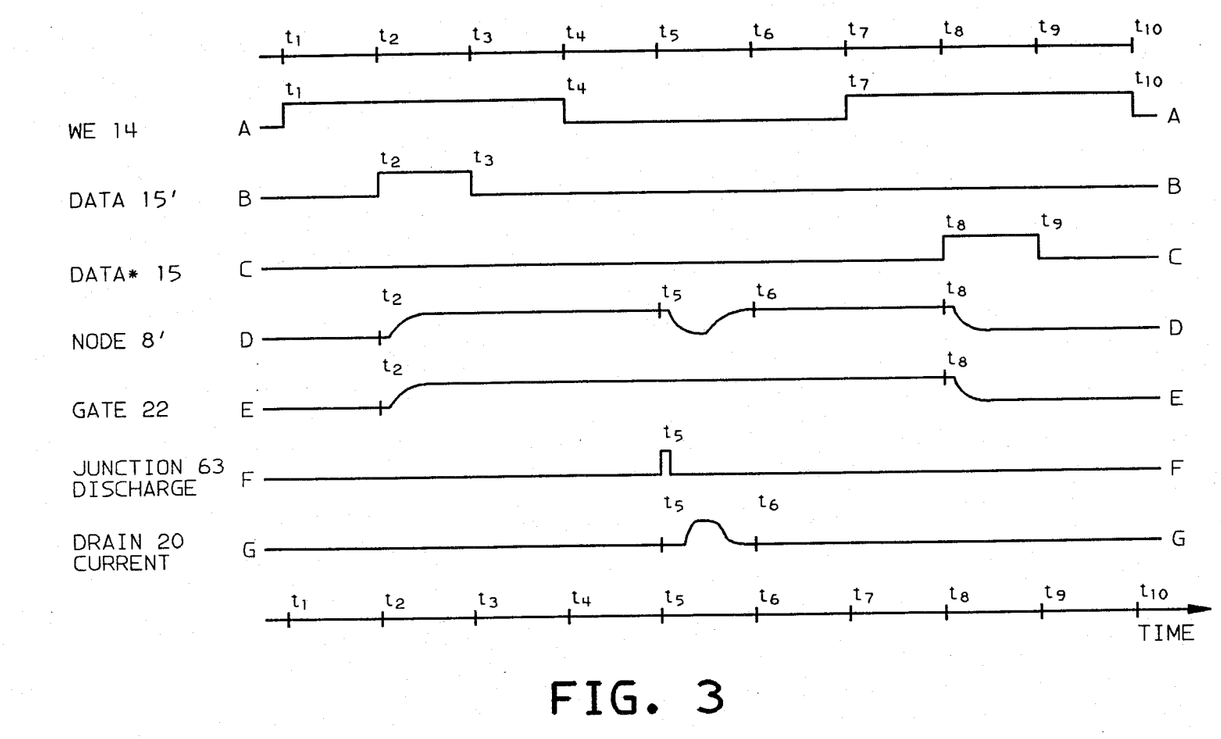
FIG. 3 is a timing diagram showing the operation of the invention.

The waveform A of FIG. 3 shows when the write-enable (WE) 14 signal is on, during which the binary state of the latch 6 may be changed. The WE 14 signal is on for the write interval of from t1 to t4, at which instant it turns off. The read interval follows from t4 to t7. The WE 14 signal is then on again for a second write interval of from t7 to t10.

To write a binary "1" into the latch 6, the DATA 15' is turned on during the interval from t2 to t3, as shown in waveform B of FIG. 3. This causes the latch node 8 to be grounded through NFET devices 12' and 16'. This turns off the NFET active device 50 in the latch 6 so that the potential of node 8' starts to rise after t2 to positive Vdd, as is shown by waveform D of FIG. 3.

The low potential on the second node 8 causes the inverter 24 to output a positive Vdd potential at its output 28. Since WE 14 is on, the positive Vdd potential will be conducted through the NFET transfer device 30 to the gate 22 of the MOS capacitor 18 after t2, as is shown in waveform E of FIG. 3. The MOS capacitor 18 will therefore form a charge sheet in its channel which increases its gate-to-channel capacitance to a magnitude of approximately 0.02 picoFarads. This additional capacitive load is applied to the second node 8 of the latch 6.

The opposite MOS capacitor 18' provides a low capacitive loading on the first node 8' because of the ground potential being applied to its gate 22' and the positive Vdd potential being applied to its drain diffusion 20' by the node 8'.

After t4 when the WE 14 goes off, the ballast capacitor 32 maintains the positive voltage bias on the gate 22 of the MOS capacitor 18, with respect to its drain diffusion 20.

SOFT ERROR PROTECTION OPERATION

As was discussed above, when the latch 6 is in its binary "1" state, the drain 62 of the NFET active device 50 is reversed biased with respect to the P-type substrate 54. Assume that during the read interval at t5, a cosmic ray 68 passes through the depleted region of the PN junction 63 of the drain 62, as is shown by waveform F of FIG. 3. This electrostatic perturbation will cause the first node 8' to discharge in 0.1 to 0.2 nanoseconds, dropping the potential at node 8' to approximately ground potential, as is shown at t5 for waveform D of FIG. 3. After t5, both the NFET depletion load 52 and the NFET depletion load 72 will compete in trying to raise the potential of the nodes 8' and 8, respectively to positive Vdd.

During the interval following the cosmic ray event at t5, the potential on the gate 22 of the MOS capacitor 18 remains positive with respect to node 8, thereby maintaining the additional capacitive loading on node 8, as seen in waveform E of FIG. 3.

During the interval following t5, the NFET depletion device only needs to supply current to charge up the node 8'. However, the NFET depletion mode load device 72 must supply current to charge the MOS capacitor 18 as well as the node 8. The additional flow of current to the drain diffusion 20 of the MOS capacitor 18, is shown between t5 and t6 on waveform G of FIG. 3.

Thus the first node 8' will rise faster in potential and will reliably set the latch 6 into its previous binary storage state, as is shown at t6 on waveform D of FIG. 3.

RETURN TO NORMAL OPERATION

After the recovery of the latch 6 from the electrostatic perturbation caused by the cosmic ray, the latch will return to normal operations. A second write interval occurs between t7 and t10, as seen on waveform A of FIG. 3.

A binary "0" will be written into the latch by turning on the DATA* 15' signal during t8 to t9, as seen on waveform C of FIG. 3, thereby grounding the node 8', as seen on waveform D of FIG. 3. This raises the potential on the second node 8, to Vdd.

The high potential of positive Vdd on node 8 is inverted by the inverter 24 to become ground potential which is passed through the NFET device 30 to the gate 22 of the MOS capacitor 18, as seen after t8 on waveform E of FIG. 3. The high potential of node 8 and the low potential of the gate 22 removes the charge sheet in the channel of the MOS capacitor 18. Thus the gate-to-channel capacitive loading on the second node 8 is minimized in the read interval following t10. In this manner, a switched capacitive loading is employed to protect the latch 6 against soft errors.

It is understood that the protected latch 6 can be a storage device such as a storage cell in a random access memory array.

Although a specific embodiment of the invention has been disclosed, it will be understood by those having skill in the art that changes can be made in the details of the disclosed embodiment without departing from the spirit and the scope of the invention.

What is claimed:

1. A soft error protection circuit for a storage cell having a first node and a second node which are respectively connected to a charging source, said first node being selectively charged at least during a write interval, to represent a stored, first binary logic state for said storage cell, comprising:

an insulated gate, field effect capacitor having a diffusion electrode connected to said second node and having a gate electrode, for selectively loading said second node with an additional capacitance;

an inverter circuit having an input connected to said second node and an output connected to said gate electrode of said capacitor, for applying a capacitance enhancing bias to said gate electrode in at least a read interval following said write interval, when said first binary logic state has been stored in said storage cell, to apply said additional capacitance to said second node;

said charging source supplying charge to both said first node and said second node at least following a soft error event which has caused said first node to become at least partially discharged during said read interval;

said additional capacitance applied to said second node preventing said second node from recharging as fast as said first node following said soft error event, by sinking a portion of the charge supplied from said charging source to said second node;

whereby said first node will resume its previously charged condition, thereby preserving the stored logic state of said storage cell following a soft error event.

2. A soft error protection circuit for a latch having a first input/output node and a second input/output node which are respectively connected to a charging source, said first node being selectively charged at least during a write interval, to represent a stored, first binary logic state for said latch, comprising:

an insulated gate, field effect capacitor having a diffusion electrode connected to said second node and having a gate electrode, for selectively loading said second node with an additional capacitance;

an inverter circuit having an input connected to said second node and an output connected to said gate electrode of said capacitor, for applying a capacitance enhancing bias to said gate electrode in at least a read interval following said write interval, when said first binary logic state has been stored in said latch, to apply said additional capacitance to said second node;

said charging source applying charge to both said first node and said second node at least following a soft error event which has caused said first node to become at least partially discharged during said read interval;

said additional capacitance applied to said second node preventing said second node from recharging as fast as said first node following said soft error event, by sinking a portion of the charge supplied from said charging source to said second node, said first node resuming its previously charged condition;

said second node being selectively charged at least during a second write interval, to represent a stored, second binary logic state for said latch;

a second insulated gate, field effect capacitor having a diffusion electrode connected to said first node and having a second gate electrode, for selectively loading said first node with a second additional capacitance;

a second inverter circuit having an input connected to said first node and an output connected to said second gate electrode of said second capacitor, for applying a capacitance enhancing bias to said second gate electrode in at least a second read interval following said second write interval, when said second binary logic state has been stored in said latch, to apply said second additional capacitance to said first node;

said charging source supplying charge to both said second node and said first node at least following a second soft error event which has caused said second node become at least partially discharged during said second read interval;

said second additional capacitance applied to said first node preventing said first node from recharging as fast as said second node following said second soft error event, by sinking a portion of the charge supplied from said charging source to said first node, said second node resuming its previously charged condition;

whereby, the stored logic state of said latch is preserved following a soft error event.

3. A soft error protection circuit for a latch having a first input/output node and a second input/output node which are respectively connected to a charging source, said latch being connected to a first binary state input device which is enabled by a write-enable input, said first node being selectively charged at least during a write interval when said write-enable input is on, to represent a stored, first binary logic state for said latch, comprising:

an insulated gate, field effect capacitor having a diffusion electrode connected to said second node and having a gate electrode, for selectively loading said second node with an additional capacitance when its gate said biased with respect to said diffusion electrode;

an inverter circuit having an input connected to said second node and an output;

a transfer field effect transistor device having its source-drain path connected between said output of said inverter and said gate electrode of said capacitor, and having its gate connected to said write-enable input, for applying a capacitance enhancing bias produced by said output of said inverter to said gate electrode of said capacitor in said write interval when said write-enable input is on, to apply said additional capacitance to said second node;

said charging source supplying charge to both said first node and said second node at least following a soft error event which has caused said first node to become at least partially discharged during said read interval;

said additional capacitance applied to said second node preventing said second node from recharging as fast as said first node following said soft error event, by sinking a portion of the charge supplied from said charging source to said second node;

whereby said first node will resume its previously charged condition, thereby preserving the stored logic state of said latch following a soft error event.

4. The circuit of claim 3, which further comprises:

a ballast capacitor connected between said gate of said insulated gate field effect capacitor and said transfer field effect transistor, for maintaining said capacitance enhancing bias on said gate electrode of said insulated gate field effect capacitor during a read interval following said write interval, when said write-enable input is off.

5. A soft error protection circuit for a latch having a first input/output node and a second input/output node which are respectively connected to a charging source, said latch being connected to a first binary state input device which is enabled by a write-enable input, said first node being selectively charged at least during a first write interval when said write-enable input is on, to represent a stored, first binary logic state for said latch, comprising:

a first insulated gate, field effect capacitor having a diffusion electrode connected to said second node and having a gate electrode, for selectively loading said second node with a first additional capacitance when its gate is biased with respect to said diffusion electrode;

a first inverter having an input connected to said second node and an output;

a first transfer field effect transistor device having its source-drain path connected between said output of said inverter and said gate electrode of said first capacitor, and having its gate connected to said write-enable input, for applying a capacitance enhancing bias produced by said output of said first inverter to said gate electrode of said first capacitor in said write interval when said write-enable input is on, to apply said first additional capacitance to said second node;

said charging source supplying charge to both said first node and said second node at least following a soft error event which has caused said first node to become at least partially discharged during a first read interval following said first write interval;

said first additional capacitance applied to said second node preventing said second node from recharging as fast as said first node following said soft error event, by sinking a portion of the charge supplied from said charging source to said second node, so that thereby said first node will resume its previously charged condition;

said latch being connected to a second binary state input device which is enabled by a write-enable input, said second node being selectively charged at least during a second write interval when said write-enable input is on, to represent a stored, second binary logic state for said latch;

a second insulated gate, field effect capacitor having a diffusion electrode connected to said first node and having a gate electrode, for selectively loading said first node with a second additional capacitance when its gate is biased with respect to its diffusion electrode;

a second inverter having an input connected to said first node and an output;

a second transfer field effect transistor device having its source-drain path connected between said output of said second inverter and said gate electrode of said second insulated gate field effect capacitor, and having its gate connected to said write-enable input, for applying a capacitance enhancing bias produced by said output of said second inverter to said gate electrode of said second insulated gate field effect capacitor in said second write interval when said write-enable input is on, to apply said second additional capacitance to said first node;

said charging source supplying charge to both said second node and said first node at least following a soft error event which has caused said second node to become at least partially discharged during a second read interval following said second write interval;

said second additional capacitance applied to said first node preventing said first node from recharging as fast as said second node following said soft error event, by sinking a portion of the charge supplied from said charging source to said first node, so that thereby said second node will resume its previously charged condition;

whereby the stored logic state of said latch is preserved following a soft error event.

6. The circuit of claim 5, which further comprises:

a first ballast capacitor connected between said gate of said first insulated gate field effect capacitor and said first transfer field effect transistor, for maintaining said capacitance enhancing bias on said gate electrode of said first insulated gate field effect capacitor during said first read interval following said first write interval, when said write-enable input is off;

a second ballast capacitor connected between said gate of said second insulated gate field effect capacitor and said second transfer field effect transistor, for maintaining said capacitance enhancing bias on said gate electrode of said second insulated gate field effect capacitor during said second read interval following said second write interval, when said write-enable input is off.

* * * * *